(12) United States Patent
Choi et al.

(10) Patent No.: US 11,685,656 B2
(45) Date of Patent: Jun. 27, 2023

(54) METHOD FOR MANUFACTURING MONOCRYSTALLINE GRAPHENE

(71) Applicant: RESEARCH & BUSINESS FOUNDATION SUNGKYUNKWAN UNIVERSITY, Suwon-si (KR)

(72) Inventors: Jae-Young Choi, Suwon-si (KR); Bum Jun Kim, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 33 days.

(21) Appl. No.: 17/395,984

(22) Filed: Aug. 6, 2021

(65) Prior Publication Data

US 2022/0041453 A1 Feb. 10, 2022

(30) Foreign Application Priority Data

Aug. 7, 2020 (KR) .................. 10-2020-0099298
Apr. 15, 2021 (KR) .................. 10-2021-0048996

(51) Int. Cl.
| | | |
|---|---|---|
| C01B 32/186 | (2017.01) | |
| B01J 23/72 | (2006.01) | |
| C23C 16/26 | (2006.01) | |
| C30B 29/02 | (2006.01) | |
| C30B 25/18 | (2006.01) | |
| C23C 16/02 | (2006.01) | |

(52) U.S. Cl.
CPC .............. *C01B 32/186* (2017.08); *B01J 23/72* (2013.01); *C23C 16/0227* (2013.01); *C23C 16/26* (2013.01); *C30B 25/186* (2013.01); *C30B 29/02* (2013.01); *C01B 2204/02* (2013.01); *C01P 2002/01* (2013.01); *C01P 2002/70* (2013.01); *C01P 2002/82* (2013.01); *C01P 2004/03* (2013.01)

(58) Field of Classification Search
CPC .... C01B 32/186; C01B 2204/02; B01J 23/72; C23V 16/0227; C23V 16/26; C30B 25/186; C30B 29/02; C01P 2002/01; C01P 2002/70; C01P 2002/82; C01P 2004/03
See application file for complete search history.

(56) References Cited

PUBLICATIONS

Qi, Yue, et al. "Controllable synthesis of graphene using novel aromatic 1,3, 5-triethynylbenzene molecules on Rh (111)." RSC advances 5.93 (2015): 76620-76625.*
Deng, Bing, et al. "Wrinkle-free single-crystal graphene wafer grown on strain-engineered substrates." ACS nano 11.12 (2017): 12337-12345.*
Zhang, Yanfeng, et al. "Different growth behaviors of ambient pressure chemical vapor deposition graphene on Ni (111) and Ni films: A scanning tunneling microscopy study." Nano Research 5.6 (2012): 402-411.*
Arias, Pedro, et al. "In Situ Variable—Temperature Scanning Tunneling Microscopy Studies of Graphene Growth Using Benzene on Pd (111)." ACS nano 14.1 (2019): 1141-1147.*

(Continued)

*Primary Examiner* — Richard M Rump
(74) *Attorney, Agent, or Firm* — NSIP Law

(57) ABSTRACT

A method for manufacturing monocrystalline graphene, includes supplying an aromatic carbon gas onto a single-crystalline metal catalyst to manufacture the monocrystalline graphene.

13 Claims, 15 Drawing Sheets

(56) References Cited

PUBLICATIONS

Yu, Hak Ki, et al. "Chemical vapor deposition of graphene on a "peeled-off" epitaxial cu (111) foil: A simple approach to improved properties." ACS nano 8.8 (2014): 8636-8643.*

Kwak, Jinsung, et al. "Near room-temperature synthesis of transfer-free graphene films." Nature communications 3.1 (2012): 645.*

* cited by examiner

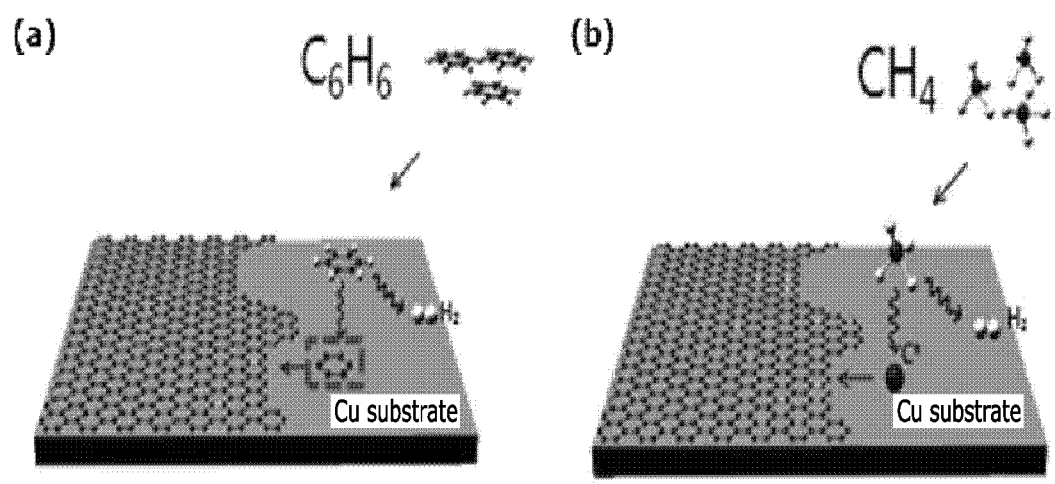
[FIG. 1]

[FIG. 2]
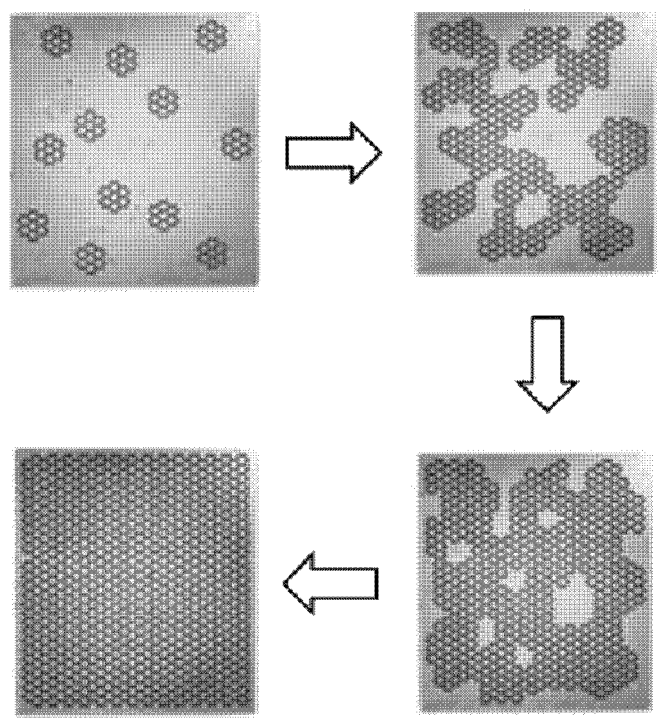

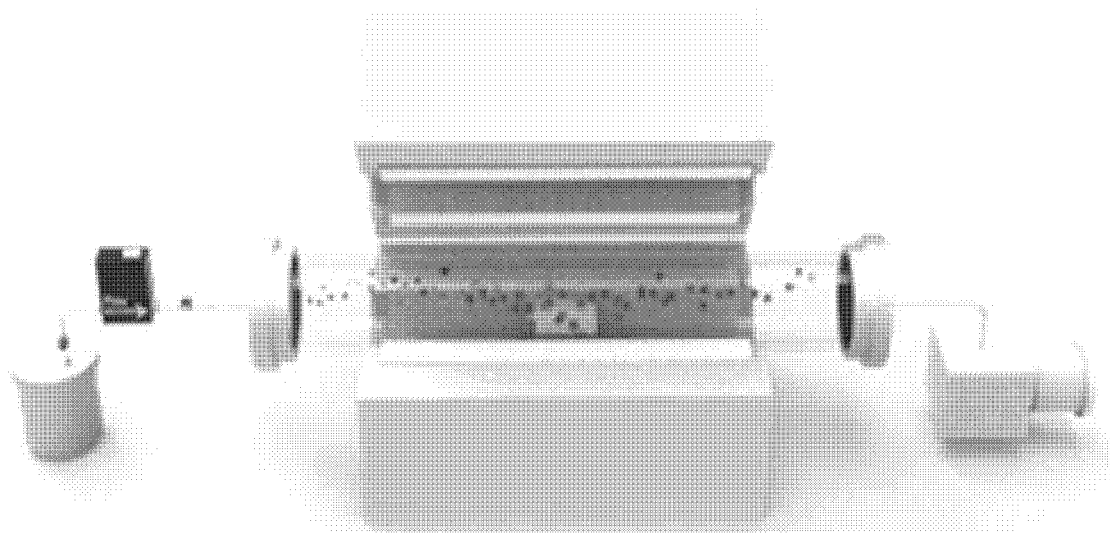
[FIG. 3]

[FIG. 4]
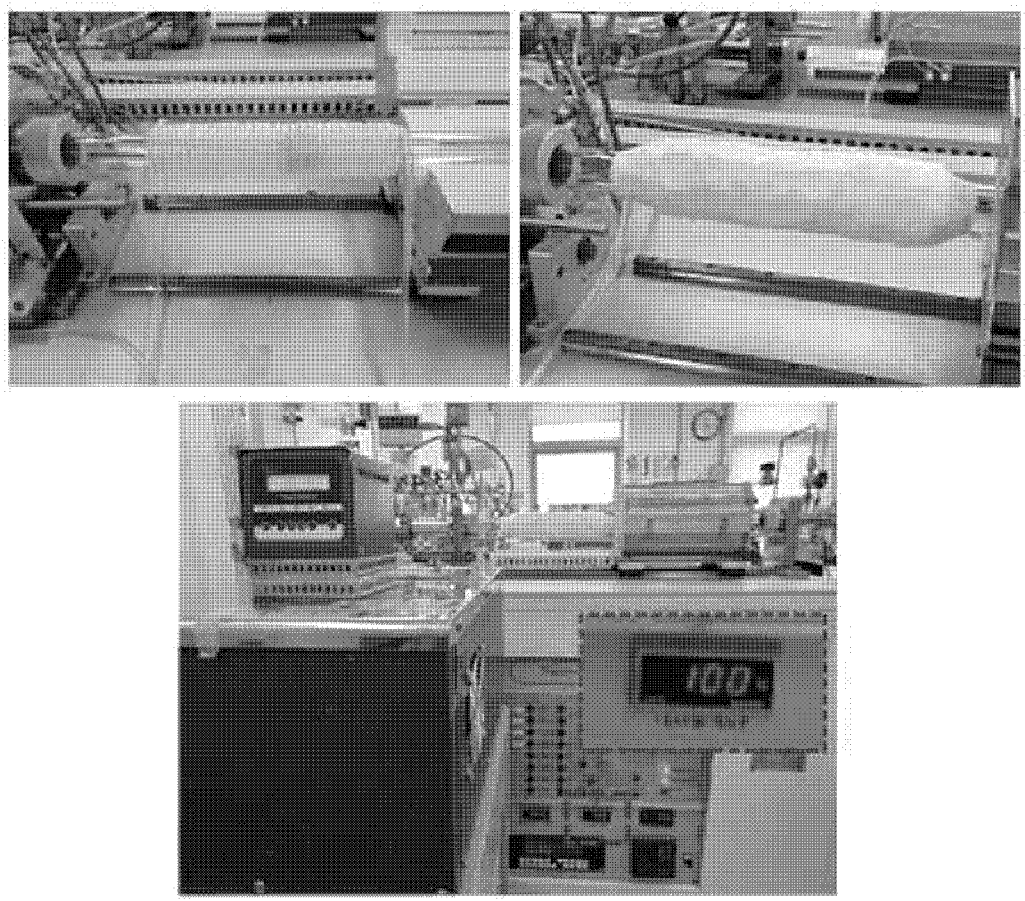

[FIG. 5]
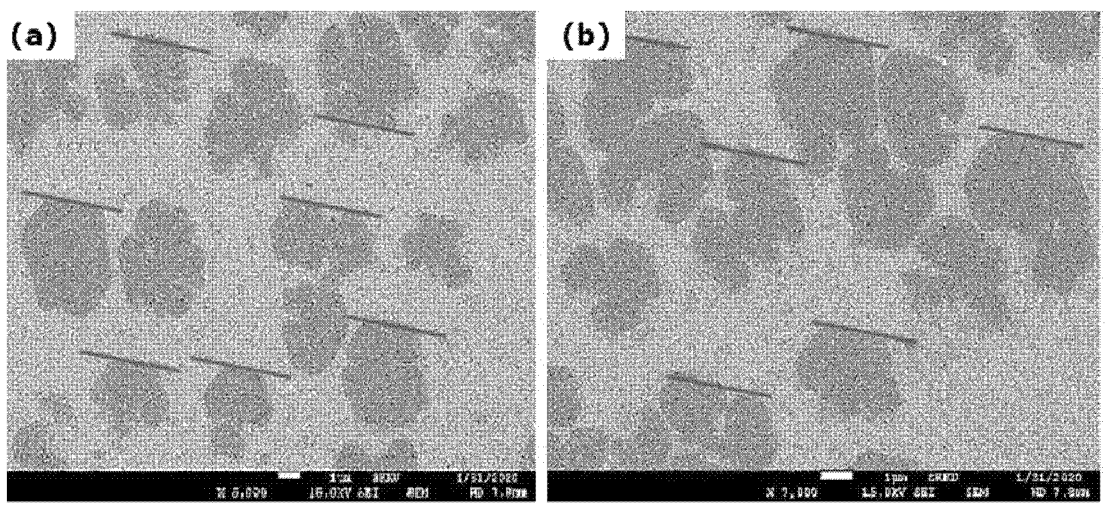

[FIG. 6]
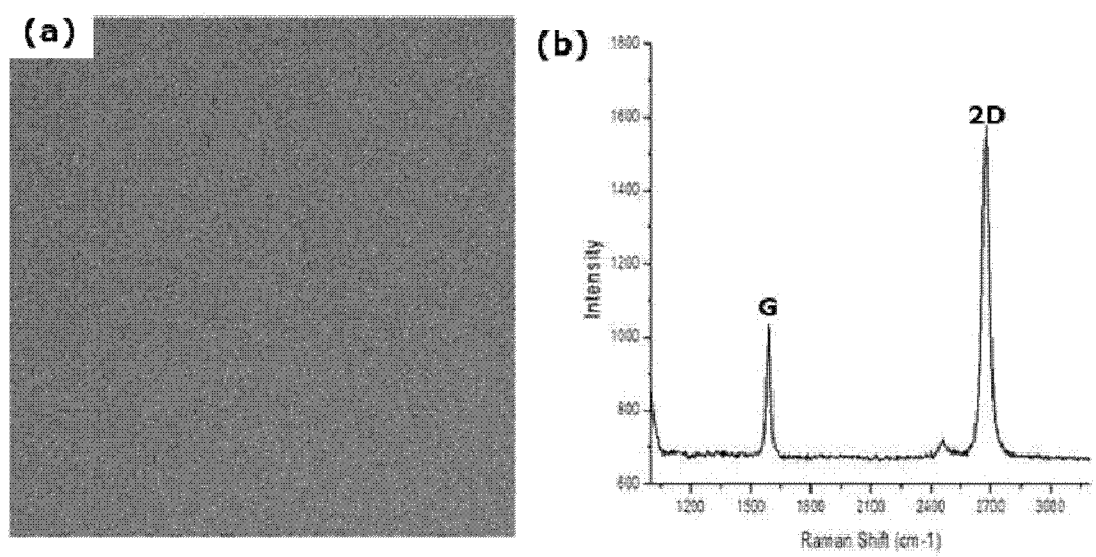

[FIG. 7]
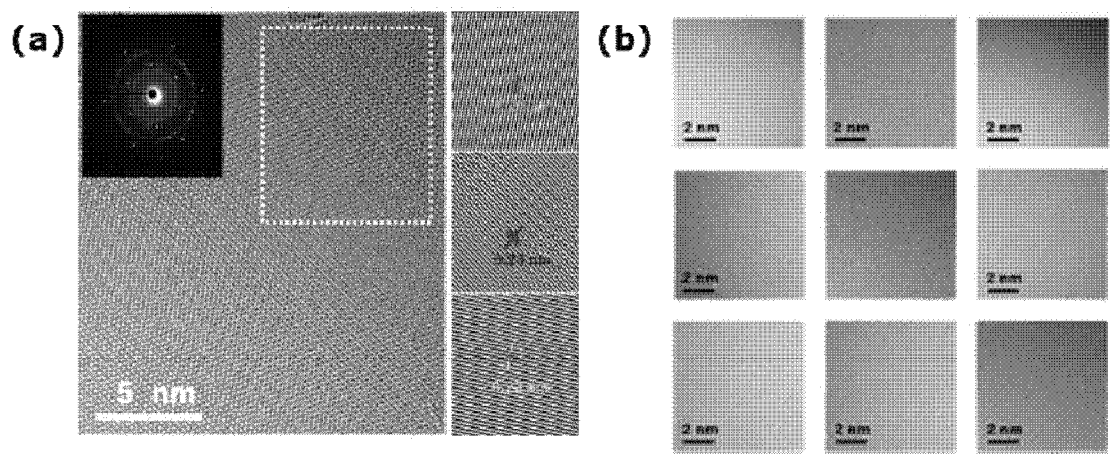

[FIG. 8]
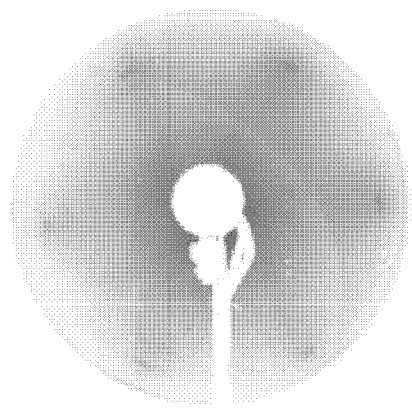

[FIG. 9]
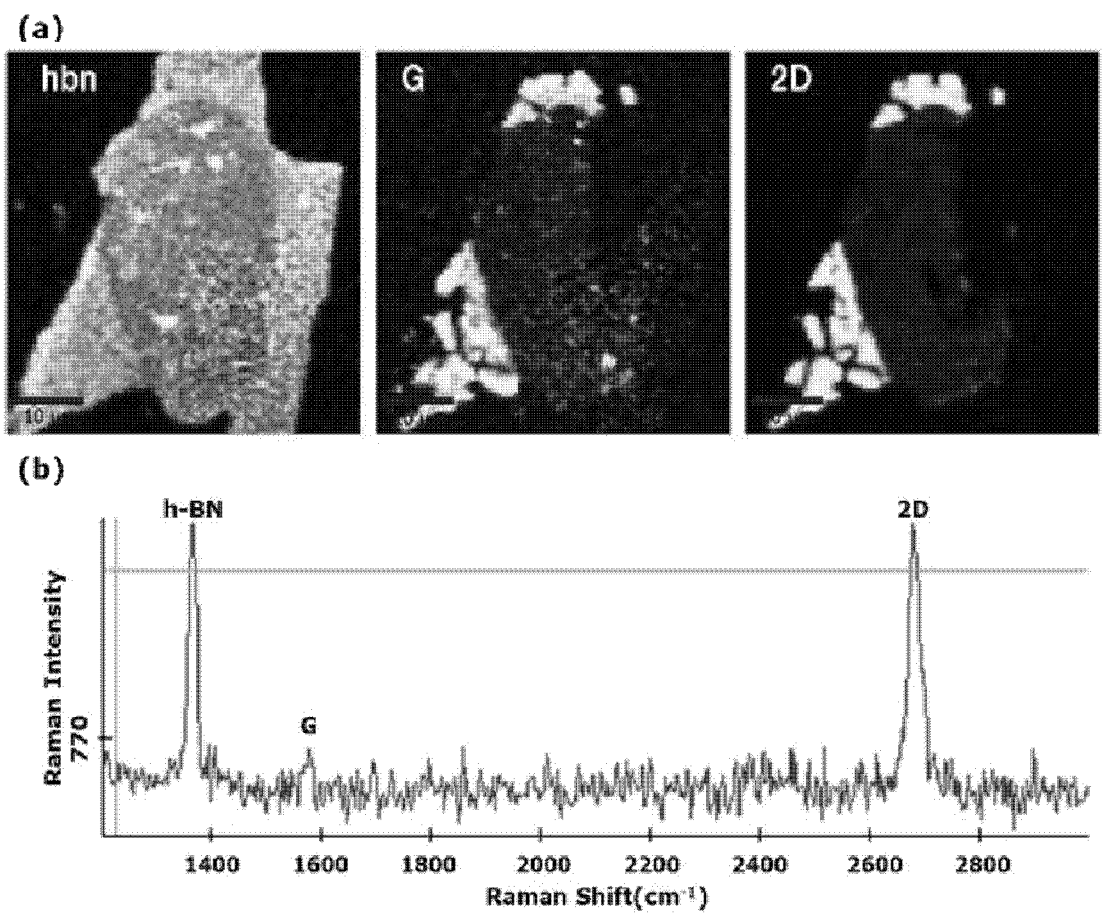

[FIG. 10]
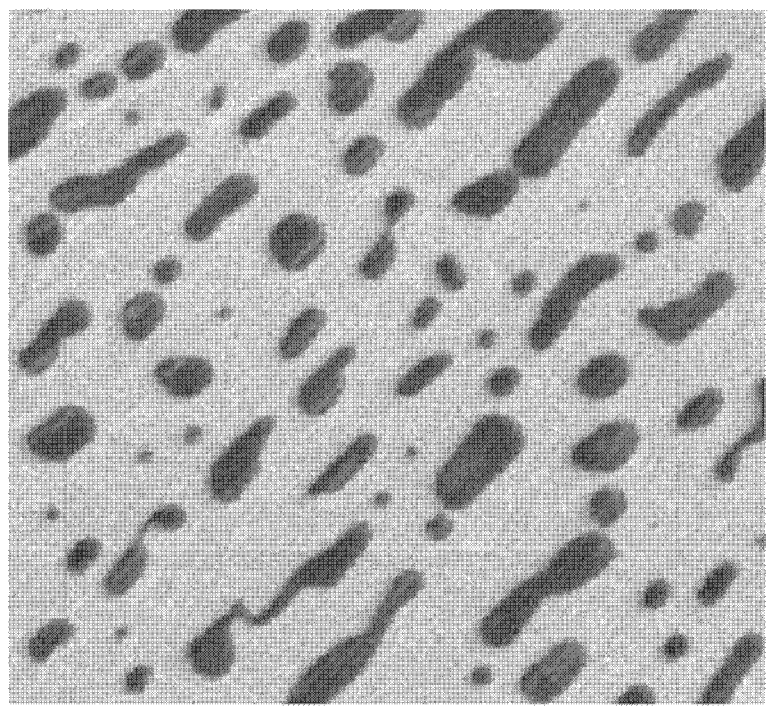

[FIG. 11]
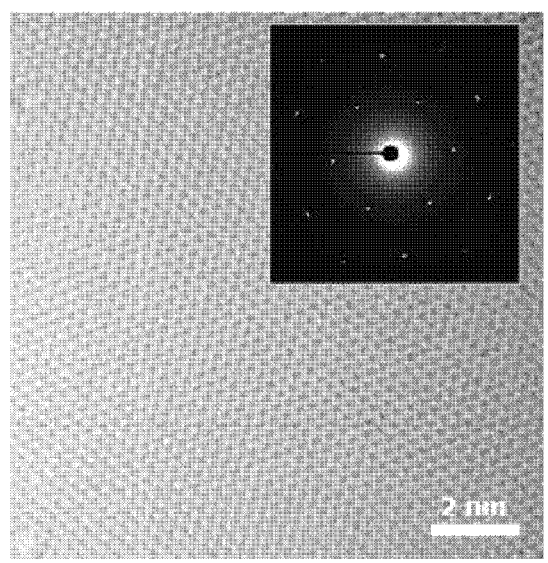

[FIG. 12]
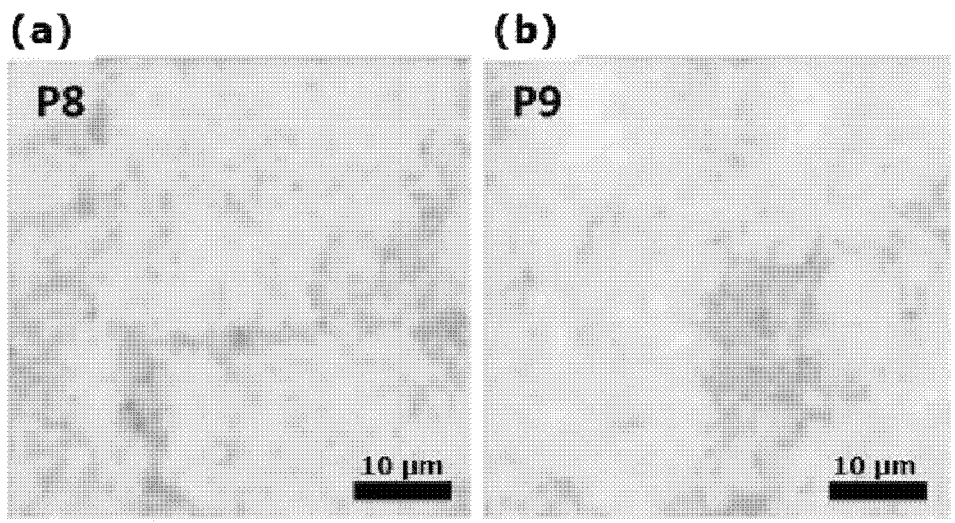

[FIG. 13]
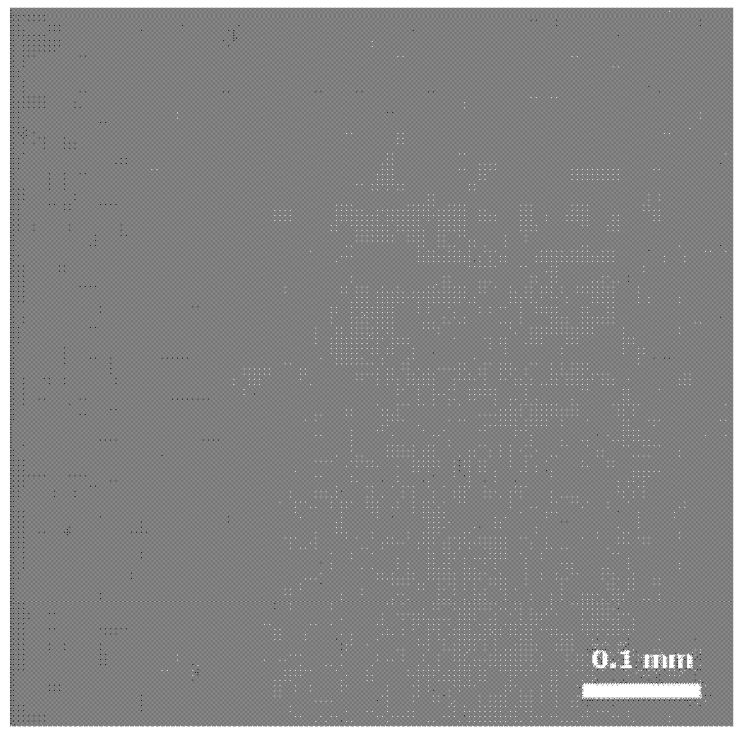

[FIG. 14]
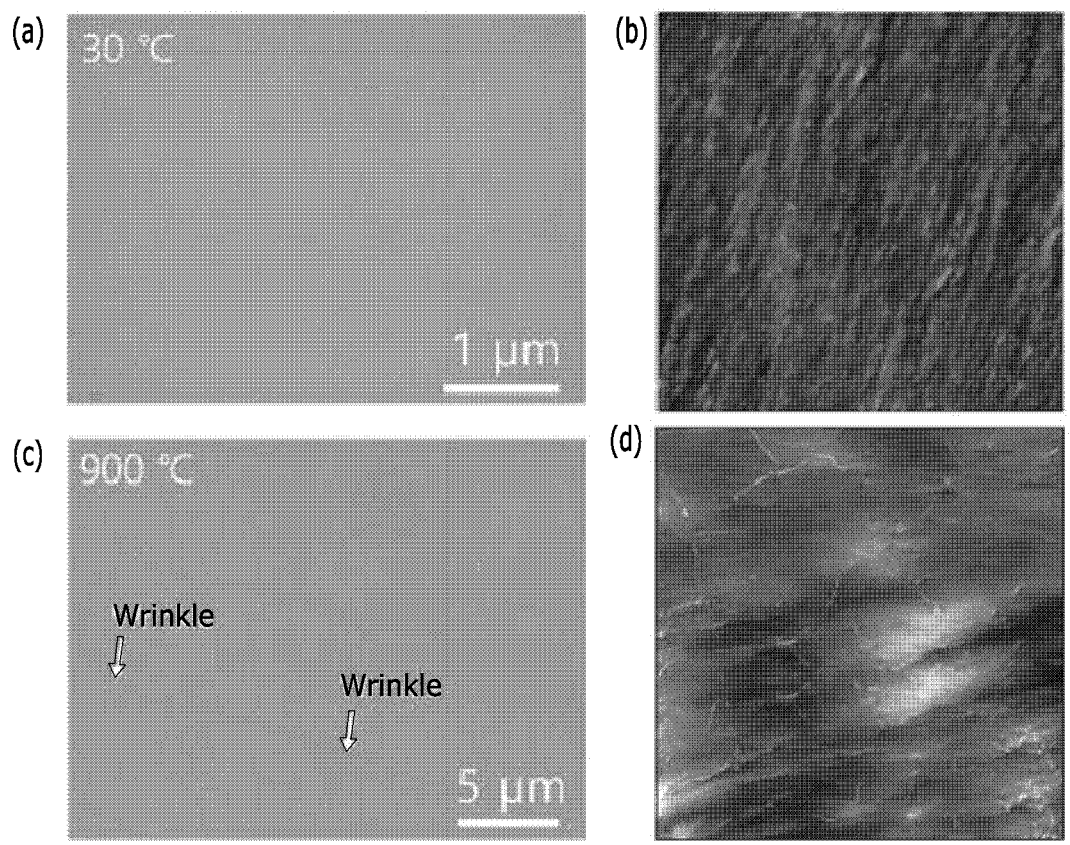

[FIG. 15]
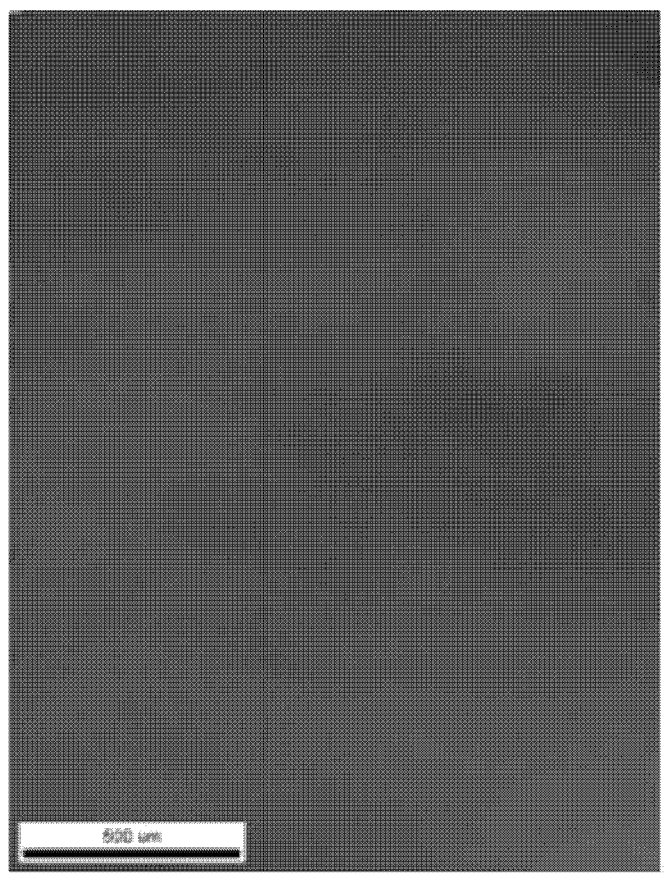

METHOD FOR MANUFACTURING MONOCRYSTALLINE GRAPHENE

CROSS-REFERENCE TO RELATED APPLICATIONS

This application claims the benefit under 35 USC 119(a) of Korean Patent Application No. 10-2020-0099298 filed on Aug. 7, 2020, and Korean Patent Application No. 10-2021-0048996 filed on Apr. 15, 2021, in the Korean Intellectual Property Office, the entire disclosures of which are incorporated herein by reference for all purposes.

BACKGROUND

1. Field

The present application relates to a method for manufacturing monocrystalline graphene.

2. Description of the Related Art

Graphene is a two-dimensional carbon material with an ultra-thin film structure composed of a single carbon atom layer forming a hexagonal honeycomb-shaped structure. Graphene has advantages of excellent electron mobility, strength, thermal conductivity, and transparency, making it suitable as a next-generation material with excellent properties that can be used in displays, secondary batteries, solar cells, light-emitting devices, catalysts, sensors, etc.

However, since a high temperature of 1,000° C. or higher has been essential in the synthesis process of graphene, it has had a problem of huge economic loss. Further, performing growth regulation itself by finely controlling a stability problem caused by such high-temperature growth conditions and a methane gas required for growth at high temperatures is a very challenging study. Since a high-temperature process is essential, there is a problem that the possibility of application to various application fields is less.

To grow graphene in the conventional art, a high-temperature condition of 1,000° C. or higher is essential, and research on graphene growing at 300° C. to 500° C. has recently been conducted to develop graphene grown at low temperatures, but a sufficiently low-temperature condition for commercialization is required.

Korean Registered Patent No. 1523172, which is the background technology of the present application, relates to a technology for growing large-area high-quality graphene using a CVD auxiliary device. It is disclosed in the registered patent that a deposited metal thin film can stably grow into a crystalline thin film up to about 1,000° C. as the CVD auxiliary device includes a substrate provided in a space part formed by a cover plate and a sealing part so that evaporation of a metal thin film at high temperatures is prevented. That is, the registered patent does not recognize at all a technology for synthesizing graphene at a low temperature, for example, 100° C. or lower.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing monocrystalline graphene, includes supplying an aromatic carbon gas onto a single-crystalline metal catalyst to manufacture the monocrystalline graphene.

The single-crystalline metal catalyst may have a (111) plane of a metal exposed on a surface thereof.

The monocrystalline graphene may be grown by growing graphene on the (111) plane.

The method may further including removing oxides on a surface of the single-crystalline metal catalyst before supplying the aromatic carbon gas.

The removing of the oxides may be performed by any one of a heat treatment, a plasma treatment, a light treatment, or treatment with chemicals.

The supplying the aromatic carbon gas onto the single-crystalline metal catalyst may be performed at 100° C. or lower.

The supplying the aromatic carbon gas onto the single-crystalline metal catalyst may be performed at 50° C. or lower.

The supplying the aromatic carbon gas onto the single-crystalline metal catalyst may be performed at 30° C. or lower.

The supplying the aromatic carbon gas onto the single-crystalline metal catalyst may be performed at room temperature without an additional heat supply.

The supplying the aromatic carbon gas onto the single-crystalline metal catalyst may be performed in a vacuum state.

The single-crystalline metal catalyst may include a metal selected from the group consisting of Cu, Ni, Sc, Ti, V, Cr, Mn, Fe, Co, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, Rg, Cn, and combinations thereof.

The supplying the aromatic carbon gas onto the single-crystalline metal catalyst may be performed by an organometallic chemical vapor deposition process.

The method may further include converting a polycrystalline metal catalyst to the single-crystalline metal catalyst by heat-treating the polycrystalline metal catalyst.

The aromatic carbon gas may include one selected from the group consisting of substitutable benzene, toluene, xylene, naphthalene, anthracene, benzopyrene, and combinations thereof.

Monocrystalline graphene may be manufactured by the method above.

The monocrystalline graphene may have a single-layer structure.

The monocrystalline graphene may not have wrinkles presenting thereon.

In another general aspect, a system for manufacturing monocrystalline graphene, includes disposing a metal catalyst within a chamber of a chemical vapor deposition apparatus, removing oxides on a surface of the metal catalyst, and supplying an aromatic carbon gas onto the chamber at room temperature without an additional heat supply.

Other features and aspects will be apparent from the following detailed description, the drawings, and the claims.

BRIEF DESCRIPTION OF THE DRAWINGS (a) of FIG. 1 is a schematic diagram for a method for synthesizing monocrystalline graphene according to an embodiment of the present application, and (b) of FIG. 1 is a schematic diagram for a conventional method for synthesizing graphene.

FIG. 2 is a schematic diagram of a growth process of monocrystalline graphene according to an embodiment of the present application.

FIG. 3 is a schematic diagram of an apparatus for manufacturing monocrystalline graphene according to an embodiment of the present application.

FIG. 4 is a photograph of an apparatus for manufacturing monocrystalline graphene according to an example of the present application.

(a) and (b) of FIG. 5 are epitaxial growth analysis results of monocrystalline graphene according to an example of the present application.

(a) of FIG. 6 is a scanning electron microscope (SEM) image of monocrystalline graphene grown entirely according to an example of the present application, and (b) of FIG. 6 is a Raman spectrum therefor.

(a) and (b) of FIG. 7 are transmission electron microscope (TEM) images of monocrystalline graphene according to an example of the present application.

FIG. 8 is a low energy electron diffraction (LEED) single crystal analysis result of monocrystalline graphene according to an example of the present application.

(a) of FIG. 9 are Raman mapping images of monocrystalline graphene according to an example of the present application, and (b) of FIG. 9 is a Raman spectrum for the monocrystalline graphene.

FIG. 10 is SEM images of monocrystalline graphene according to an example of the present application.

FIG. 11 is a TEM image of monocrystalline graphene according to an example of the present application.

(a) and (b) of FIG. 12 are Raman mapping images of monocrystalline graphene according to an example of the present application.

FIG. 13 is an image of monocrystalline graphene according to an example of the present application observed with an optical microscope (OM).

(a) of FIG. 14 is an image of monocrystalline graphene according to an example of the present application observed with an optical microscope, (b) of FIG. 14 is an image of the monocrystalline graphene according to the example observed with an atomic force microscope (AFM), (c) of FIG. 14 is an image of monocrystalline graphene according to a comparative example of the present application observed with an optical microscope, and (d) of FIG. 14 is an image of the monocrystalline graphene according to the comparative example observed with the AFM.

FIG. 15 is an electron backscatter diffraction (EBSD) image of a single-crystalline metal catalyst according to an example of the present application.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

When unique manufacture and material allowable errors of numerical values are suggested to mentioned meanings of terms of degrees used in the present specification such as "about", "substantially", etc., the terms of degrees are used in the numerical values or as a meaning near the numerical values, and the terms of degrees are used to prevent that an unscrupulous infringer unfairly uses a disclosure content in which exact or absolute numerical values are mentioned to help understanding of the present application. Further, throughout the specification of the present application, "a step to do ~" or "a step of ~" does not mean "a step for ~".

Throughout the specification of the present application, a term of "a combination thereof" included in a Markush type expression, which means a mixture or combination of one or more selected from the group consisting of constituent elements described in the Markush type expression, means including one or more selected from the group consisting of the constituent elements.

Hereinafter, a method for manufacturing monocrystalline graphene according to the present application will be described in detail with reference to embodiments, examples, and drawings. However, the present application is not limited to these embodiments, examples, and drawings.

Using methane at 1,000° C. or higher, or a temperature condition of 300° C. to 500° C. was essential in a conventional process of growing monocrystalline graphene. In particular, in the case of the process of growing the monocrystalline graphene at 1,000° C. or higher, stability such as high temperature and methane supply control is low, and in the process of cooling the monocrystalline graphene after forming the monocrystalline graphene, a copper substrate, which is a substrate, contracts while the graphene expands so that wrinkles may be formed on the graphene.

Further, when graphene is grown at high temperatures, there may be a problem that carbon atoms formed by dehydrogenation of a carbon source may be absorbed on a catalyst substrate or inserted between a seed and a catalyst to form a graphene double layer.

A method for manufacturing monocrystalline graphene according to the present application enables effective growth of graphene under low-temperature conditions such as 100° C. or lower or room temperature, furthermore enables the growth of the monocrystalline graphene under the temperature conditions in the chamber (about 30° C.) without additional heat supply, and allows the process to be performed at low temperatures to suppress the wrinkles formed on the graphene due to the shrinkage of the substrate and the expansion of the graphene.

Specifically, according to the present application, monocrystalline graphene may effectively induce epitaxial growth by growing graphene on a metal having a (111) plane; a monocrystalline graphene structure may be effectively grown at low temperatures through this.

According to the present application, the monocrystalline graphene may effectively grow the monocrystalline graphene structure by growing the graphene on the metal having the (111) plane. Furthermore, according to the present application, the monocrystalline graphene may effectively form monocrystalline graphene by using a metal catalyst having a lattice structure similar to that of the monocrystalline graphene.

According to the present application, the single-crystalline metal catalyst may maintain a non-oxidized single crystal state by the vacuum state in a method for manufacturing monocrystalline graphene.

Further, in the case of growing a single crystal without epitaxial growth, the synthesis time takes several hours to several days, so that it is known as a very inefficient growth method. In contrast, according to the present application, the monocrystalline graphene may be grown within several minutes to several hours through the epitaxial growth method in the method for manufacturing the monocrystalline graphene.

In the conventional method, carbons are connected one by one by supplying methane of $C_1$, but in a method for manufacturing monocrystalline graphene according to the present application, rapid growth may be induced by supplying benzene of 06 so that six carbons are connected.

As a technical means for achieving the above-mentioned technical tasks, the first aspect of the present application provides a method for manufacturing monocrystalline graphene, including supplying an aromatic carbon gas onto a single-crystalline metal catalyst.

In a conventional technique for manufacturing monocrystalline graphene, carbon atoms and hydrogen atoms (or molecules) were separated using methane gas at a high temperature of 1,000° C., and the monocrystalline graphene was manufactured on a substrate so that the separated carbon atoms form a graphene structure. However, the conventional technique is performed at high temperatures so that there is a risk of explosion due to methane. In addition, when cooling the monocrystalline graphene to room temperature, a wrinkle phenomenon occurring due to a thermal expansion coefficient difference between the substrate and graphene may occur. As a result, there is a problem that the quality of graphene may deteriorate.

(a) of FIG. 1 is a schematic diagram for a method for synthesizing monocrystalline graphene according to an embodiment of the present application, and (b) of FIG. 1 is a schematic diagram for a conventional method for synthesizing graphene.

Referring to FIG. 1, carbons are connected one to another by supplying methane of $C_1$ in an existing method, but six carbons are connected to enable rapid growth to be induced since benzene of 06 is supplied in the monocrystalline graphene according to the present application.

FIG. 2 is a schematic diagram of a growth process of monocrystalline graphene according to an example of the present application. Specifically, FIG. 2 exemplarily illustrates each operation of the epitaxial growth.

The epitaxial growth is a crystal-growing method in which the grains may be grown into a single crystal without forming a grain boundary when grains having the same directionality are merged.

In this regard, in the typical case of growing a single crystal without epitaxial growth, the synthesis time takes several hours to several days and thus a very inefficient growth method. Contrarily, in the method for manufacturing monocrystalline graphene according to the present application, the monocrystalline graphene may be grown within several minutes to several hours through the epitaxial growth method.

According to an embodiment of the present application, although the operation of removing oxides on the surface of the single-crystalline metal catalyst before supplying the aromatic carbon gas may be further included, the present application is not limited thereto.

According to an embodiment of the present application, although removing the oxides on the surface of the metal catalyst may be performed by any one or any two or more of reducing heat treatment, plasma treatment, light treatment, or treatment with chemicals, the present application is not limited thereto.

According to an embodiment of the present application, although the operation of supplying the aromatic carbon gas onto the single-crystalline metal catalyst may be performed in a vacuum state, the present application is not limited thereto.

According to the present application, the single-crystalline metal catalyst may maintain a non-oxidized single crystal state by the vacuum state in a method for manufacturing monocrystalline graphene.

According to an embodiment of the present application, although the single-crystalline metal catalyst may have a (111) plane of the metal exposed on the surface thereof, the present application is not limited thereto. In this regard, since a method for manufacturing monocrystalline graphene according to the present application is performed on the single-crystalline metal catalyst, the single-crystalline metal catalyst may also serve as a substrate.

According to an embodiment of the present application, although graphene may be grown on the (111) plane so that monocrystalline graphene is grown, the present application is not limited thereto.

In this regard, monocrystalline graphene, according to the present application, may effectively induce epitaxial growth by growing the graphene on the metal having the (111) plane, and a monocrystalline graphene structure may be effectively grown at low temperatures through this.

According to an embodiment of the present application, although the single-crystalline metal catalyst may include a metal selected from the group consisting of Cu, Ni, Sc, Ti, V, Cr, Mn, Fe, Co, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, Rg, Cn, and combinations thereof, the present application is not limited thereto. Desirably, although the metal catalyst may be copper (Cu), the present application is not limited thereto.

According to an embodiment of the present application, although the operation of supplying the aromatic carbon gas onto the single-crystalline metal catalyst may be performed at 100° C. or lower, the present application is not limited thereto.

According to an embodiment of the present application, although the operation of supplying the aromatic carbon gas onto the single-crystalline metal catalyst may be performed at 50° C. or lower, the present application is not limited thereto.

According to an embodiment of the present application, although the operation of supplying the aromatic carbon gas onto the single-crystalline metal catalyst may be performed at 30° C. or lower, the present application is not limited thereto.

According to an embodiment of the present application, although the operation of supplying the aromatic carbon gas onto the single-crystalline metal catalyst may be performed at room temperature without additional heat supply, the present application is not limited thereto. According to the present application, desirably, a method for manufacturing monocrystalline graphene may be performed at room temperature.

Unlike the conventional art in which graphene single crystals were synthesized using methane under a high temperature of 1,000° C. or higher, since monocrystalline graphene according to the present application allows graphene to be grown on the metal having the (111) plane, the monocrystalline graphene according to the present application effectively induces the epitaxial growth so that it is possible to grow a single crystal using benzene even at a low-temperature state, for example, 100° C. or lower, 50° C. or lower, or 30° C. or lower. Furthermore, it is possible to grow the monocrystalline graphene at a temperature condition within the chamber (about 30° C.) without a separate heat supply.

According to an embodiment of the present application, although supplying the aromatic carbon gas onto the single-crystalline metal catalyst may be performed by an organometallic chemical vapor deposition process, the present application is not limited thereto.

According to an embodiment of the present application, the method for manufacturing monocrystalline graphene may further include converting the polycrystalline metal catalyst to the single-crystalline metal catalyst by heat-treating the polycrystalline metal catalyst, but the present application is not limited thereto.

According to an embodiment of the present application, although the aromatic carbon gas may include one selected from the group consisting of substitutable benzene, toluene, xylene, naphthalene, anthracene, benzopyrene, and combinations thereof, the present application is not limited thereto.

FIG. 3 is a schematic diagram of an apparatus for manufacturing monocrystalline graphene according to an embodiment of the present application.

The second aspect of the present application provides the monocrystalline graphene manufactured by the method according to the first aspect of the present application.

With respect to the monocrystalline graphene according to the second aspect of the present application; however, detailed descriptions of parts overlapping with the first aspect of the present application have been omitted, the contents described in the first aspect of the present application may be equally applied to the second aspect of the present application even if the descriptions have been omitted.

As described above, monocrystalline graphene may be grown on a single-crystalline metal catalyst by the method according to the first aspect.

Polycrystalline graphene is one in which small crystals with respective different atomic arrangements are connected to form one crystal. In such polycrystalline graphene, defects exist in the interface where the crystals meet, and the inherent properties of the material deteriorate accordingly. On the other hand, according to the present application, monocrystalline graphene does not have such a problem of polycrystals and thus has excellent physical properties and high utility.

According to an embodiment of the present application, although the monocrystalline graphene may have a single-layer structure, the present application is not limited thereto.

According to the present application, a method for manufacturing monocrystalline graphene uses an aromatic hydrocarbon containing a benzene ring. At this time, when the process of supplying the aromatic hydrocarbon onto the single-crystalline metal catalyst is performed at high temperatures, dehydrogenation occurs in the benzene ring so that the benzene ring may collapse. Carbon atoms formed by the collapse of the benzene ring infiltrate between a graphene layer and a substrate (single-crystalline metal catalyst), or on defects of the graphene so that additional graphene may be formed between the graphene layer and the substrate or on the graphene.

However, when an aromatic hydrocarbon is supplied onto a single-crystalline metal catalyst at a low temperature (for example, 100° C. or lower) as in a method for manufacturing monocrystalline graphene according to the present application, dehydrogenation does not occur in the benzene ring so that it may be arranged in a form in which the benzene ring is maintained. Furthermore, since the benzene ring does not collapse, it is possible to prevent the infiltration of carbon atoms between the graphene layer and the substrate (single-crystalline metal catalyst), or on the graphene defects so that a phenomenon that the graphene is additionally formed on the graphene may be suppressed. Accordingly, monocrystalline graphene, according to the present application, may be formed in a single-layer structure. If necessary, the monocrystalline graphene of the single-layer structure may be transferred and laminated to manufacture monocrystalline graphene of a multi-layer structure.

According to an embodiment of the present application, although the monocrystalline graphene may not have wrinkles presenting thereon, the present application is not limited thereto.

Conventional monocrystalline graphene was manufactured by supplying methane onto a single-crystalline metal catalyst at a temperature of 1,000° C. or higher. At this time, in the process of cooling the single-crystalline metal catalyst on which the monocrystalline graphene is formed, since the single-crystalline metal catalyst contracts. In contrast, the monocrystalline graphene expands, wrinkles may form due to a difference in the coefficient of thermal expansion between monocrystalline graphene manufactured by a conventional method and the single-crystalline metal catalyst.

However, the monocrystalline graphene, according to the present application, is formed on the single-crystalline metal catalyst at 100° C. or lower, desirably at room temperature, and does not require cooling of the single-crystalline metal catalyst during the manufacturing process so that wrinkles do not form on the monocrystalline graphene.

A third aspect of the present application provides a system for manufacturing monocrystalline graphene, the system including the operations of: disposing a metal catalyst within a chamber of a chemical vapor deposition apparatus; removing oxides on the surface of the metal catalyst; and supplying an aromatic carbon gas onto the chamber, wherein the operation of supplying the aromatic carbon gas onto the chamber is performed at room temperature without additional heat supply.

With respect to the system for manufacturing monocrystalline graphene according to the third aspect of the present application, although detailed descriptions of parts overlapping with the first aspect and/or the second aspect of the present application have been omitted, the contents described in the first aspect and/or the second aspect of the present application may be equally applied to the third aspect of the present application even if the descriptions have been omitted.

Hereinafter, the present disclosure will be described in more detail through Examples, but the following Examples are for illustrative purposes only and are not intended to limit the scope of the present application.

[Example 1-1]: Method for Manufacturing a Single-Crystalline Metal Catalyst

After preparing a copper (Cu) foil for copper substrate cleaning (25 μm, 99.9%, Alfa Aesar) to a size of 1 cm×1 cm, immersing the prepared copper foil in a 10% nitric acid solution for 30 seconds, and then immersing the copper foil in DI water for about 1 minute to remove the nitric acid solution, the copper foil was blown with nitrogen gas (99.9%) to form a single-crystalline metal catalyst with an exposed (111) plane, and the single-crystalline metal catalyst was placed in the center of a reaction chamber within a CVD.

FIG. 15 is an electron backscatter diffraction (EBSD) image of the prepared single-crystalline metal catalyst.

Referring to FIG. 15, it may be confirmed that only the (111) plane of the single-crystalline metal catalyst is exposed.

[Example 1-2]: Method for Manufacturing Monocrystalline Graphene

Graphene growth was induced through metal-organic chemical vapor deposition (MOCVD) to synthesize monocrystalline graphene.

To this end, after first putting 100 ml of benzene into a canister of an organometallic chemical vapor deposition apparatus, heating the metal canister to a pressure of about 50 torr and a temperature of 50° C. so that benzene was supplied in a gas phase, and completing the supply of benzene, the temperature of the metal container was cooled to room temperature.

Subsequently, benzene was started to be supplied from the canister containing benzene within the organometallic chemical vapor deposition apparatus prepared to 30° C. to a chamber in which the single-crystalline metal catalyst (Cu foil) was located in the center. The supply of benzene was carried out for a desired growth time and was carried out for 2 to 3 hours. After the growth was completed, the supply of benzene was stopped and only hydrogen was flowed to blow off the remaining benzene and stabilize the atmosphere within the chamber.

FIG. 4 is a photograph of an apparatus for manufacturing monocrystalline graphene according to an embodiment of the present application. Referring to FIG. 4, it is a photograph that shows low-temperature graphene growth equipment that circulates heated water, and in which the temperature within the tube is set to 100° C. At this time, the temperature of a space in which the growth of graphene is induced corresponds to 100° C. or lower, and specifically, the growth of graphene may be performed at 80° C., 60° C., 40° C., or 30° C.

Example 2

Monocrystalline graphene was manufactured at room temperature by performing the same process as in Example 1, but omitting the process of heating the metal canister and the process of circulating heated water.

Comparative Example

As Comparative Example to contrast with the Examples of the method for manufacturing monocrystalline graphene according to the present application, no additional experiment was conducted, and results of research on low-temperature graphene growth described in known papers were compared with the Examples of the present application.

Generally, most of the research on low-temperature graphene growth currently in progress utilizes PECVD. However, PECVD is difficult to be an ideal solution due to problems such as the difficulty of introducing large-scale PECVD and rising manufacturing costs.

As another research that utilizes thermal CVD, research for synthesizing graphene at a low temperature of 500° C. or lower by mainly using liquid and solid carbon precursors is in progress.

As an example of graphene grown at low temperatures, graphene growth was confirmed at about 100° C. in APCVD, which was purged 5 times to create an atmosphere in which oxygen was removed using a polycrystalline copper catalyst metal at a low temperature of 300° C. or lower, and it was confirmed that the graphene could not be grown at a temperature of 100° C. or lower (reference: scientific report, low temperature grown continuous films from benzene by chemical vapor deposition at ambient pressure).

Further, there is a research of growing graphene on the $SiO_2$ substrate that is between $SiO_2$ and a nickel-metal catalyst by depositing nickel on a $SiO_2$ substrate (reference: nature communications, near room temperature synthesis of transfer-free graphene films). In this research, a polycrystalline catalyst metal rather than a single-crystalline catalyst metal was used. Graphene was grown on $SiO_2$ by diffusing carbon atoms through the grain boundary of the catalyst metal at room temperature. PMMA was used as a carbon source used.

Experimental Example 1

The growth results of the monocrystalline graphene, according to Example 1, were confirmed.

(a) and (b) of FIG. 5 are epitaxial growth analysis results of monocrystalline graphene according to an example of the present application, (a) of FIG. 6 is an SEM image of monocrystalline graphene grown entirely according to an example of the present application, and (b) of FIG. 6 is a Raman spectrum therefor, and (a) and (b) of FIG. 7 are TEM images of monocrystalline graphene according to an example of the present application.

The graphene manufactured by the method according to Example 1 above was grown at a low temperature of 100° C. or lower. Referring to FIGS. 5 to 7, it may be confirmed that the graphene has the same directionality, has a single-layer single crystalline structure (1,600 cm$^{-1}$ and 2,700 cm$^{-1}$ peaks in FIG. 6), and has a constant atomic arrangement structure even when measuring any point of graphene grown entirely as graphene atoms form a hexagonal structure.

FIG. 8 is a low energy electron diffraction (LEED) single crystal analysis result of monocrystalline graphene according to an example of the present application, and (a) of FIG. 9 are Raman mapping images of monocrystalline graphene according to an example of the present application, and (b) of FIG. 9 is a Raman spectrum for the monocrystalline graphene. Specifically, the monocrystalline graphene in FIG. 9 is Raman mapping images and Raman spectrum of a device in which h-BN/monocrystalline graphene (Example)/h-BN is arranged to have a sandwich structure form.

Referring to FIG. 8, it may be confirmed that the graphene is entirely grown monocrystalline graphene, and copper serving as a single-crystalline metal catalyst has a single crystal in the (111) direction.

Referring to FIG. 9, it may be confirmed that the monocrystalline graphene is encapsulated graphene through the simultaneous presence of h-BN, G, and 2D peaks. Further, it may be confirmed through Raman mapping analysis that graphene grown at room temperature is grown into single-layer graphene rather than multi-layer graphene. Finally, the quality of the graphene may also be checked through the results of the D band, which means defects of the grown graphene.

Experimental Example 2

Growth results of the monocrystalline graphene according to Example 2 above were confirmed.

FIG. 10 is SEM image of monocrystalline graphene according to an example of the present application.

Referring to FIG. 10, it may be confirmed that the monocrystalline graphene has a hexagonal lattice structure, and monocrystalline graphene having no grain boundary existing thereon even when it is oxidized along with a single-crystalline copper catalyst is formed.

FIG. 11 is a TEM image of monocrystalline graphene according to an example of the present application, (a) and (b) of FIG. 12 are Raman mapping images of monocrystalline graphene according to an example of the present application, and FIG. 13 is an image of monocrystalline graphene according to an example of the present application observed with an optical microscope (OM).

(a) of FIG. 14 is an image of monocrystalline graphene according to an example of the present application observed with an optical microscope, (b) of FIG. 14 is an image of the monocrystalline graphene according to the example observed with an atomic force microscope (AFM), (c) of FIG. 14 is an image of monocrystalline graphene according to a comparative example of the present application observed with an optical microscope, and (d) of FIG. 14 is an image of the monocrystalline graphene according to the comparative example observed with the AFM.

Referring to FIGS. 11 to 14, it may be confirmed that the monocrystalline graphene manufactured at room temperature was formed without wrinkles.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a monocrystalline graphene, the method comprising:
   supplying an aromatic carbon gas to a single-crystalline metal catalyst placed in a process chamber for a desired growth time to grow the monocrystalline graphene,
   wherein a temperature in the process chamber is maintained at 100 degrees Celsius or less without an additional heat supply until the manufacturing of the monocrystalline graphene is completed.

2. The method of claim 1, wherein the single-crystalline metal catalyst has a (111) plane of a metal exposed on a surface thereof.

3. The method of claim 2, wherein the monocrystalline graphene is grown by growing graphene on the (111) plane.

4. The method of claim 1, further comprising:
   removing oxides on a surface of the single-crystalline metal catalyst using a chemical solution before supplying the aromatic carbon gas.

5. The method of claim 1, further comprising:
   removing oxides on a surface of the single-crystalline metal catalyst by a plasma treatment, a light treatment, or a heat treatment before supplying the aromatic carbon gas.

6. The method of claim 1, wherein the supplying of the aromatic carbon gas to the single-crystalline metal catalyst is performed at 50° C. or lower.

7. The method of claim 1, wherein the supplying of the aromatic carbon gas to the single-crystalline metal catalyst is performed at 30° C. or lower.

8. The method of claim 1, wherein the supplying of the aromatic carbon gas to the single-crystalline metal catalyst is performed at room temperature without an additional heat supply.

9. The method of claim 1, wherein the supplying of the aromatic carbon gas to the single-crystalline metal catalyst is performed in a vacuum state.

10. The method of claim 1, wherein the single-crystalline metal catalyst includes a metal selected from the group consisting of Cu, Ni, Sc, Ti, V, Cr, Mn, Fe, Co, Zn, Y, Zr, Nb, Mo, Tc, Ru, Rh, Pd, Ag, Cd, Hf, Ta, W, Re, Os, Ir, Pt, Au, Hg, Rf, Db, Sg, Bh, Hs, Mt, Ds, Rg, Cn, and combinations thereof.

11. The method of claim 1, wherein the supplying of the aromatic carbon gas to the single-crystalline metal catalyst is performed by an organometallic chemical vapor deposition process.

12. The method of claim 1, further comprising converting a polycrystalline metal catalyst to the single-crystalline metal catalyst by heat-treating the polycrystalline metal catalyst.

13. The method of claim 1, wherein the aromatic carbon gas includes one selected from the group consisting of substitutable benzene, toluene, xylene, naphthalene, anthracene, benzopyrene, and combinations thereof.

* * * * *